United States Patent [19]

Cable

[11] Patent Number: 4,632,621
[45] Date of Patent: Dec. 30, 1986

[54] COMPONENT STACK FEED DEVICE
[75] Inventor: Michael J. Cable, Maldon, England
[73] Assignee: USM Corporation, Farmington, Conn.
[21] Appl. No.: 660,907
[22] Filed: Oct. 15, 1984
[30] Foreign Application Priority Data
Oct. 14, 1983 [GB] United Kingdom ............... 8327560
[51] Int. Cl.$^4$ .............................................. B65G 59/02
[52] U.S. Cl. .................................... 414/118; 206/328; 206/334; 206/499; 221/198; 414/417
[58] Field of Search ............... 414/118, 119, 120, 121, 414/417; 221/198, 279, 312 R, 312 A, 312 B, 312 C; 206/328, 334, 499; 29/740, 741, 809

[56] References Cited

U.S. PATENT DOCUMENTS

| | | | |
|---|---|---|---|
| 2,902,689 | 9/1959 | Petersen | 29/741 X |
| 3,063,578 | 11/1962 | Millar | 414/118 |
| 3,116,958 | 1/1964 | Blair et al. | 221/279 X |
| 4,127,432 | 11/1978 | Kuwano et al. | 414/118 X |
| 4,346,817 | 8/1982 | Karcher | 221/312 R |
| 4,381,601 | 5/1983 | Tamai et al. | 29/740 |
| 4,451,191 | 5/1984 | Torre | 414/118 |
| 4,483,441 | 11/1984 | Akizawa et al. | 206/328 |

FOREIGN PATENT DOCUMENTS

| | | | |
|---|---|---|---|
| 2266229 | 10/1975 | France | 221/279 |
| 57-90323 | 6/1982 | Japan | 414/118 |

Primary Examiner—Leslie J. Paperner
Attorney, Agent, or Firm—William F. White

[57] ABSTRACT

A feed device is disclosed for presenting electronic components to the pick-up head of a component processing machine. The feed device includes a magazine in which the electrical components are stacked one on top of another. The magazine is held within supports in the component processing machine which also has a lift that raises the stack of components within the magazine in response to a signal from a detector. The stack of components is lifted until the detector detects a component at an uppermost, pick-up position within the magazine.

13 Claims, 3 Drawing Figures

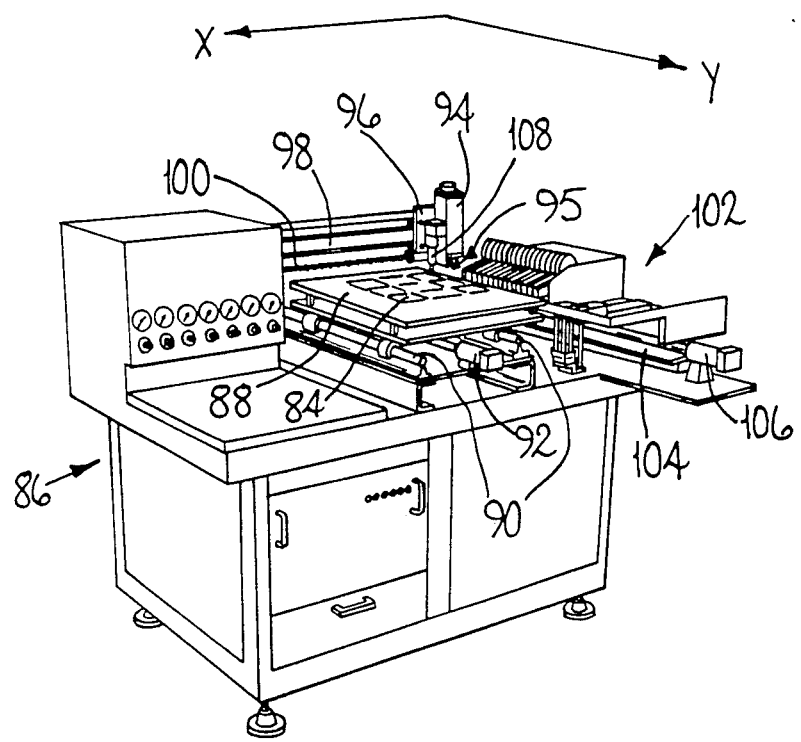
Fig_1

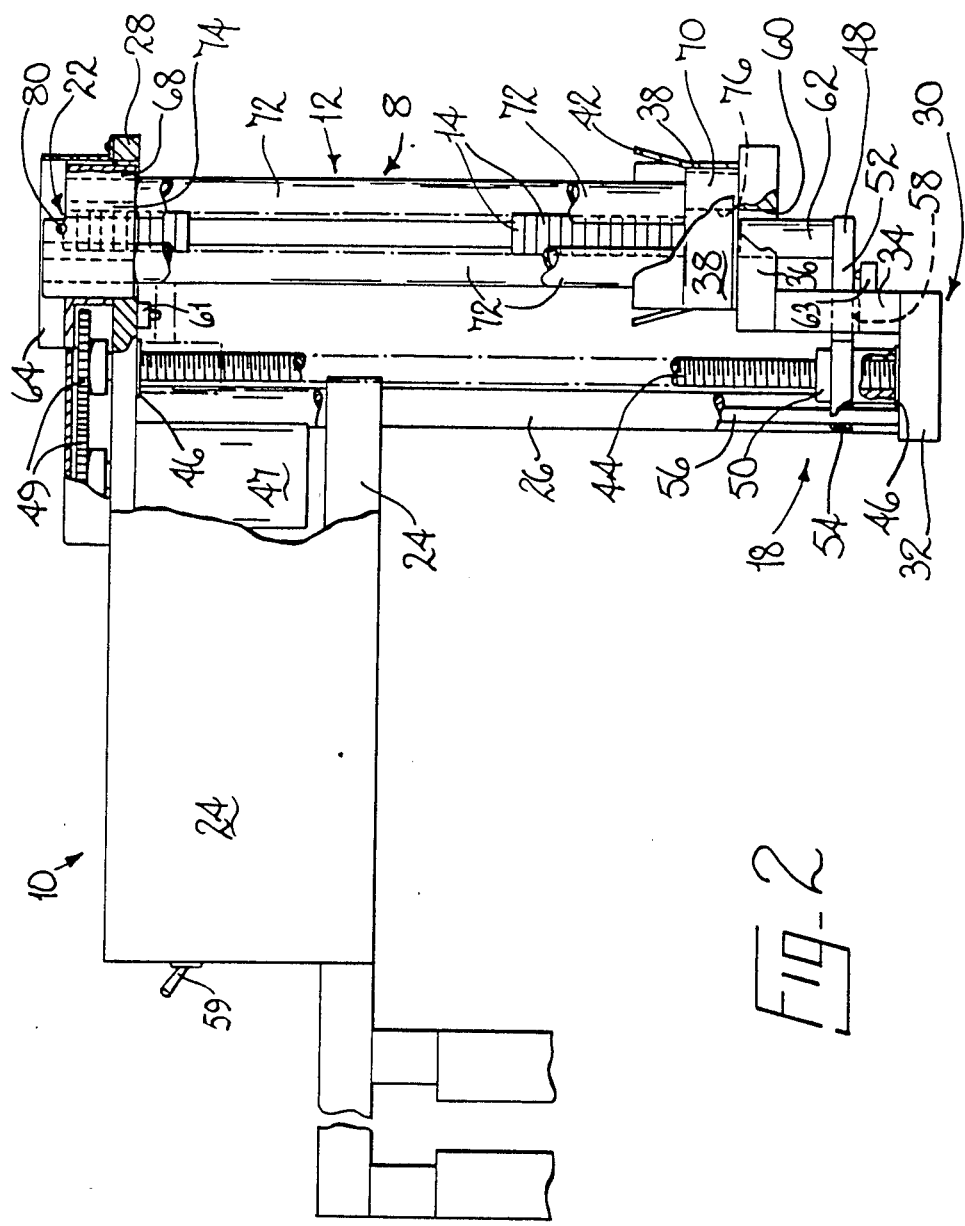

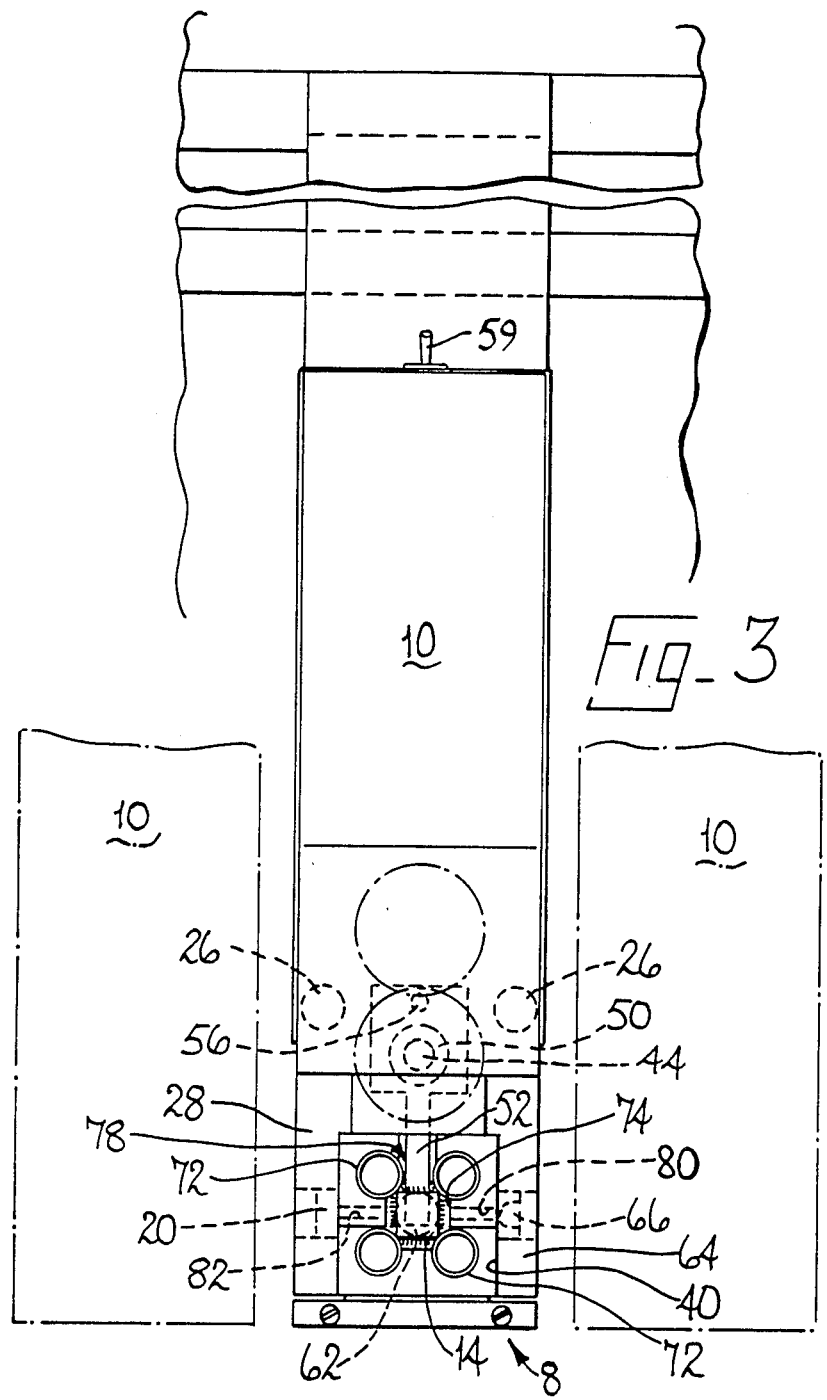

COMPONENT STACK FEED DEVICE

FIELD OF THE INVENTION

This invention is concerned with component stack feed devices especially devices suitable for use in feeding electronic components for further manipulation, for example placement on a suitable substrate e.g. a printed circuit board.

BACKGROUND OF THE INVENTION

It is commonly desired to supply electronic components one after another for subsequent handling, e.g. for placing on a substrate. Various means of supplying such components have been proposed, for example tapes in which the components are retained in pockets and so-called sticks in which the components are stored side by side in a generally tubular member along which they are moved for removal at an end portion, by vibration. The previously known methods of supplying components are satisfactory for many types of component, however where larger components are to be fed, for example about one centimeter square, with connector means projecting from each side of the component, so-called "flat packs", none of the previously proposed means of supplying the components has proved altogether satisfactory. For example, if such components are supplied in the so-called "stick" form there is a big risk that the connector members will become entangled thus preventing proper feeding of the components along the sticks and the components are too large to be conveniently supplied in tapes. It has therefore previously been customary to manually position such components on substrates.

OBJECTS OF THE INVENTION

One of the various objects of the present invention is to provide a device for presenting electronic components, especially square or rectangular flat packs having connector members projecting from each side.

A further object of the invention is to provide an improved magazine for electronic components.

Another object of the invention is to provide an improved machine for positioning electronic components on a substrate.

SUMMARY OF THE INVENTION

The invention provides in one of its aspects a device for presenting electronic components to a pick-up head comprising support means for mounting a magazine in which components are stacked one on top of another so that an uppermost one of the components can be removed from an upper end portion of the magazine by the pick-up head, lifting means arranged to raise the stack of components in a magazine mounted on the support means on receipt of an appropriate signal, and detector means for detecting whether or not an uppermost component carried in a magazine mounted on the support means is at a pick-up position and signalling the lifting means to raise the stack until a component is detected at the pick-up position.

Preferably in a device as set out in the last preceding paragraph the support means comprises upper and lower brackets, conveniently projecting from a main structure of the device, the lower bracket comprising a socket in which a lower end portion of a magazine is received to locate the lower end portion of the magazine and the upper bracket having an opening in which an upper end portion of the magazine is snugly received whereby to mount the magazine in a desired orientation on the support means.

Preferably in a device according to the invention, the lifting means comprises a lifting member mounted on the support means for movement along a slot extending lengthwise of a magazine located on the support means and so constructed and arranged as to be introduced into the slot beneath a stack of components in the magazine. Suitably the lifting means comprises a lead screw mounted for rotation on the support means, the lifting member comprising a nut received on the lead screw, and drive means e.g. an electric motor and a suitable gear arrangement carried by the main structure of the device, by which the lead screw may be rotated to raise and lower the lifting member.

Preferably the detector means of a device in accordance with the invention comprises a radiation detector e.g a photo sensitive device, towards which radiation (light where the detector is a photosensitive device) is directed across the pick-up position so that when a component is in the pick-up position it prevents the radiation reaching the detector but when no component is in the pick-up position the radiation is detected by the detector which signals the lifting means.

The invention also provides a magazine for electronic components comprising a guide portion having a passage shaped in cross-section to receive the components so that they are stacked one on another, a lower end portion extending partially across the passage to prevent components escaping from the lower end portion of the passage and a slot extending lengthwise of the passage through which a lifting member may be introduced into the passage and moved upwardly along the passage to expel components from the upper end portion of the passage.

A preferred magazine according to the invention comprises an upper end portion connected to the lower end portion by the guide portion, the guide portion comprising cylindrical columns e.g. tubes, end portions of which are secured to the upper and lower end portions of the magazine to provide the passage and the upper end portion having an opening aligned with the passage through which the components are withdrawn.

The invention further provides a machine for positioning electronic components on a substrate comprising a support for the substrate, a pick-and-place head, moving means for effecting relative movement between the support and head whereby to place a component carried by the head at a desired position on the substrate, component supply means for presenting components to the head for positioning of the substrate, the component supply means comprising support means for mounting a magazine in which components are stacked, one on top so that an uppermost one of the components can be removed from an upper end portion of the magazine by the pick-up head, lifting means arranged to raise the stack of components in a magazine mounted on the support means on receipt of an appropriate signal, and detector means for detecting whether or not an uppermost component carried in a magazine mounted on the support means is at a pick-up position and signalling the lifting means to raise the stack until a component is detected at the pick-up position.

In a preferred machine in accordance with the invention the support for the substrate is mounted for movement in the X direction and the pick-and-place tool is mounted for movement in the Y direction, the moving means comprising suitable motors for effecting relative movement between the support and tool so that the tool can be positioned relative to a substrate mounted on the support at any desired coordinates, the moving means further comprising means for raising and lowering the tool whereby to place a component carried by the tool at the desired position on the substrate. In such a machine the component supply means conveniently comprises a carrier also mounted for movement in the X direction parallel with the support, the locus of movement of the pick-and-place head extending over both the full width of the support and a component supply position to which components stored in a plurality of supply means mounted on the carrier may be moved by movement of the carrier in the X direction. Operation of the machine in a desired sequence to place components on the substrate (which may be, for example a printed circuit board) may be effected by any suitable means, preferably by a suitable microprocessor control. The component supply means comprises at least one device in accordance with the invention but, depending on the component to be supplied may also include one or more components supply means of known type, for example those referred to previously.

There now follows a detailed description to be read with reference to the accompanying drawings of a device for presenting electronic components to a pick-up head, embodying the invention. A magazine embodying the invention is also described hereinafter for use with the device. A machine for positioning electronic components on a printed circuit board on which the device embodying the invention is mounted is also described hereafter.

DESCRIPTION OF THE DRAWINGS

In the accompanying drawings:

FIG. 1 is a perspective view of a component placing machine embodying the invention, FIG. 2 is a view in side elevation partly in section and with parts broken away of a feed device embodying the invention, for presenting electronic components to a pick-up head; and FIG. 3 is a plan view of the device shown in FIG. 2.

DESCRIPTION OF THE PREFERRED EMBODIMENT

The feed device 8 for presenting electronic components to a pick-head embodying the invention, comprises support means including a main structure 10, for mounting a magazine (for example the magazine 12 described hereinafter) in which components 14 are stacked one on top of another so that an uppermost one of the components 14 can be removed from an upper end portion of the magazine 12. The device further comprises lifting means 18 arranged to raise the stack of components 14 in a magazine 12 on receipt of an appropriate signal. The device 8 further comprises detector means including a photodiode 20 for detecting whether or not an uppermost component 14 carried in the magazine 12 is at a pick-up position 22 and signalling the lifing means 18 to raise the stack until a component 14 is detected at the pick-up position 22.

As hereinbefore mentioned the support means comprises a main structure 10 which comprises frame members 24 by which the device may be mounted on a suitable carrier and to which are secured two parallel columns 26 arranged to be disposed vertically when the device is mounted for dispensing components. The structure 10 also comprises an upper bracket 28 secured to upper end portions of the columns 26 and projecting from the columns 26 at the opposite side to the frame members 24. A lower bracket 30 is secured to lower end portions of the columns 26 and comprises a tie member 32 secured to the lower end portion of the columns, a plate member 34 secured to the tie member 32 and disposed beneath the upper bracket 28 parallel with the columns 26 and spaced therefrom and projecting from the tie member 32 towards the upper bracket. A platform 36 is secured to an upper end portion of the plate member 34, parallel with the upper bracket 28 and aligned therewith. A socket 38 projects upwardly from the platform 36 and is disposed beneath and aligned with an opening 40 in the upper bracket 28. An upper end portion 42 of the socket 38 is flared outwardly for a purpose to be described hereinafter.

The lifting means 18 of the device embodying the invention described herein comprises a lead screw 44 parallel with the columns 26 and mounted for rotation in bearings 46 in the upper bracket 28 and tie member 32. Drive means by which the lead screw may be rotated comprises an electric motor 47 and gears 49 mounted on the main structure 10. The lifting means further comprises a lifting member 48 comprising a nut 50 received on the lead screw 44, an L-shaped lifting arm 52 projecting between the upper and lower brackets 28, 30 and guide means 54 slidingly received on a guide rail 56 parallel with the columns 26 and extending between the upper bracket 28 and the tie member 32. By operation of the drive means the lead screw 44 may be rotated, rotating in the nut 50 to thereby raise or lower the lifting member 48 according to the direction in which the lead screw is rotated. When the lead screw is rotated to drive the lifting member 48 to a lowermost position the lifting member is received in a slot 58 in the plate member 34 and extending upwardly through a rear wall of the socket 38, and in a slot 60 in the platform 36. When the lifting member is in this lowermost position an upwardly facing branch 62 of the arm 52 projects through the platform 36 at a central region of the socket 38.

As hereinbefore mentioned the detector means comprises a photodiode 20, the photodiode 20 is accommodated in a housing 64 mounted on an upper face of the upper bracket 28. A light source 66 is also mounted in the housing 64 at the opposite of the opening 40 to the photodiode 20. The light source 66 is arranged to direct a beam of light (infra red in the device described) at the photodiode across the opening 40 and the region between the light source 66 and photodiode 20 is the pickup position 22. The photodiode is connected to appropriate circuitry so that in the operation of the device, when light from the source 66 is received by the photodiode 20 a signal is emitted causing the motor of the drive means to rotate the lead screw 44 in such a direction as to raise the lifting member 48. When the light from the source 66 is prevented from reaching the photodiode 20 operation of the motor ceases and the lifting member 48 is stopped.

The device embodying the invention described hereinbefore is adapted to dispense electronic components 14 from the magazine 12, itself embodying the invention. The magazine 12 comprises upper and lower end portions provided by upper and lower members 68, 70. The upper and lower members 68, 70 are connected by a guide portion which comprises cylindrical columns viz tubes 72, end portions of the columns being secured to the upper and lower members 68, 70 respectively. The tubes 72 form between them a passage shaped in cross section to slidingly receive the electronic components to be stored so that they are stacked one on top of another. The upper member 68 has an opening 74 corresponding in shape with the passage and aligned with the passage so that the components can be withdrawn upwardly through the opening. The lower member 70 extends partially across the passage to prevent components escaping from the lower end of the passage and has cut in it a slot 76 aligned with the gap between an adjacent pair of the tubes, the gap thereby providing a slot extending lengthwise of the passage.

Components to be dispensed may be stacked in the magazine, using suitable apparatus if necessary, until the magazine 12 is full. The magazine may then be introduced to the device by passing the lower member 70 through the opening 40 on the upper bracket 28. The opening 40 and the lower member 70 of the magazine are so shaped that the lower member 70 may only slide through the opening 40 when the magazine 12 is correctly oriented relative to the device with the slot 76 aligned with the slot 60. The lower member 70 having been passed through the opening 40, the magazine 12 is lowered in the device until the lower member 70 enters the flared upper end portion 42 of the socket 38; as this occurs the upper member 68 of the magazine 12 is slidingly received in the opening 40 in the upper bracket, in which the upper member 68 is a close sliding fit. The magazine is lowered until the bottom face of the lower member 70 rests on the platform 36, the lower member 70 then being snugly received in the socket 38 and the upper member 68 being likewise snugly received in the opening 40 thus to mount the magazine in accurate location on the support means.

When the magazine 12 is so mounted in the support means, in correct orientation, the slot 76 in the lower member 70 of the magazine is aligned with the slots 58, 60 in the lower bracket 30. It will, of course, be realized that when a full magazine is loaded into the device the lifting member 48 must be disposed in its lower most position with the lifting arm 52 received in the slots 58, 60. Switch means 59 is provided on the device to cause the drive means to rotate the lead screw 44 in a direction to lower the lifting member 48 to the lowermost position. Limit switches 61, 63 are mounted on the brackets 28, 30 which are engaged by the lifting member 48 when it reaches its uppermost position or its lowermost position respectively, the limit switches being operative to stop operation of the motor driving the lead screw 44.

When the magazine 12 is mounted in the device, holes 80, 82 in the upper member 68 of the magazine are aligned, respectively with the light source 66 and the photodiode 20.

A two way switch (not shown) is mounted on the device 8. In a first position the switch causes the motor 47 to drive the lifting member to the lowermost position (in which it is stopped by operation of the appropriate limit switch). When a new magazine is to be used this switch is switched to the first position to retract the lifting member 48. After the new magazine 12 has been mounted in the device 8 the switch is switched to the second position which causes the motor 47 to rotate the lead screw 44 to raise the lifting member 48 in the slots 58, 60 and the branch 62 to be propelled through the slot 76 so that an upper end face of the branch 62 engages a lowermost one of the components 14 in the stack. Continued operation of the drive means raises the lifting member 48, thereby raising the stack of components through the branch 62 of the lifting member 48. The lifting member 48 continued to rise, travelling along the slot 78 which extends lengthwise of the passage in the magazine 12 until an uppermost one of the components 14 in the stack enters the pick-up position 22, thereby interrupting the beam of light from the light source 66 and causing the photodiode 22 to terminate operation of the drive means. When this uppermost one of the components 14 is removed, thereby allowing light from the source 66 to again reach the diode 20 a signal is emitted by the diode 20 reactivating the drive means and causing the lifting means 18 to again raise the stack until a further component 14 is detected in the pick-up position when operation of the drive means is again terminated as hereinbefore described. The device may be operated in this manner until the magazine 12 is empty, whereafter the magazine may be removed the member 48 retracted by operation of the two-way switch as described above and the magazine 12 replaced with a further magazine of components.

The device embodying the invention is suitably used in conjunction with a suitable pick-up head which removes the components at the pick-up position from the stack one at a time for use. Conveniently the device is mounted in a suitable machine for manipulating the components: one such machine including the device the machine itself thus embodying the invention, is described hereinafter, see especially FIG. 1, and is intended for use in positioning electronic components on a suitable substrate, for example a printed circuit board 84. The machine comprises a substantial frame 86 on which a support viz a table for the substrate is mounted on rails 90 for movement in an X direction drive by a suitable motor 92 through a Rohlex drive means (not shown) secured to the table. The machine further comprises a pick-and-place head 94 mounted on a carriage 96 supported on a rail 98 for movement in a Y direction, at right angles to the X direction of movement of the table 88.

The carriage 96 is arranged to be moved along the rail 98 by rotation of a lead screw 100 driven by a stepping motor (not shown) mounted on the frame so that the position of the pick-and-place head 94 in the Y direction can be accurately determined. Digital encoder means associated with the table 88 are provided, indicating the position of the table 88 in the X direction. Thus moving means for effecting relative movement between the table 88 and head 94 are provided so that the relative positions of the head 94 and table 88 can be determined so that the head 94 can be accurately positioned above any desired position on the printed circuit board 84 carried by the table 88.

The machine further comprises component supply means including a carrier, viz carriage 102. The carriage is mounted for movement in the X direction on rails 104 carried by the frame. The carriage 102 is moved along the rails by an electric motor 106 through a Rohlex drive secured to the carriage. The feed device described hereinbefore is mounted on the carriage 102. The feed device is so positioned that a component 14 in pick-up position is carried along a path as the carriage 102 is moved in the X direction, which carries it beneath the path of travel of the pick-and-place head 94 carried by the carriage 96. A digital encoder (not shown) is associated with the carriage 102 to emit pulses which may be used to indicate the position of the carriage 102 in the X direction. As well as one or more feed devices of the type described hereinbefore, other types of feed devices may also be mounted on the carriage 102, depending on the type of components to be fed, for example tape feed devices and "stick" feed devices. All of these feed devices are arranged to deliver components to a position in the Y direction designated a component supply position: when the head 94 is to pick up a further component it is carried by the carriage 96 until the head 94 is disposed with the pick up tool 95 disposed, in the Y direction, above the component supply position. The microprocessor control of the machine is programmed to move the carriage 102 in the X direction so that the appropriate feed device is aligned in the component supply position beneath the head 94 and the head is signalled to pick up a component with its tool 95. The component picked up is then placed in a position on the printed circuit board carried by the table 88 which is also stored in the microprocessor memory.

The feed device 8 hereinbefore described permits reliable feeding of components with projecting connections from each side with little or no risk of entanglement of the connecting members.

An adhesive dispenser 108 is also mounted on the carriage 96 and can be arranged to deposit spots of adhesive to bond components 14 on the board 84, under the control of the microprocessor, the components being placed on the slots to bond the components to the board.

I claim:

1. A device for presenting electronic components to a pick-up head of a component placement machine, said device comprising: support means for mounting a removable magazine in which components are stacked one on top of another so that an uppermost one of the components can be removed from its stacked uppermost pick-up position within the magazine by the pick-up head, lifting means arranged to raise the stack of components in the removable magazine mounted on the support means wherein the removable magazine includes a guide portion having a passage shaped in cross-section to receive the components so that they are stacked one on another, a lower end portion extending partially across the passage to prevent components escaping from the lower end portion, a slot extending lengthwise down to and including the lower end portion, whereby the lifting means is introduced into the slot from the lower end when the magazine is mounted on the support means, said lifting means being operative upon receipt of an appropriate signal, and detector means for detecting whether or not an uppermost component carried in the removable magazine mounted on the support means is at its stacked uppermost pick-up position and signalling the lifting means to raise the stack until a component is detected at the pick-up position.

2. A device according to claim 1 in which the support means comprises upper and lower brackets, the lower brackets comprising a socket in which a lower end portion of a magazine is received to locate the lower end portion and the upper bracket having an opening in which an upper end portion of the magazine is received whereby to mount the magazine in a desired orientation on the support means.

3. A device according to either one of claims 1 and 2 in which the lifting means comprises a lifting member mounted on the support means for movement along a slot extending lengthwise of a removable magazine located on the support means and so constructed and arranged as to be introduced into the slot beneath a stack of components in the magazine.

4. A device according to claim 3 in which the lifting means comprises a lead screw mounted for rotation on the support means, the lifting member comprising a nut received on the lead screw, and drive means by which the lead screw may be rotated to raise and lower the lifting member.

5. A device according to claim 3 wherein the detector means comprises a radiation detector towards which radiation is directed across the pick-up position so that when a component is in the pick-up position it prevents radiation reaching the detector but when no component is in the pick-up position the radiation is detected by the detector which signals the lifting means.

6. A device according to claim 3 comprising upper and lower limit switches which are actuated when the lifting means reaches uppermost and lowermost limit positions in its travel.

7. A device according to claim 1 wherein the magazine in which the electronic components are stacked further comprises an upper end portion connected to the lower end portion by the guide portion, the guide portion comprising cylindrical columns end portions of which are secured to the upper and lower end portions to provide the passage, and the upper end portion having an opening aligned with the passage through which the components are withdrawn.

8. A machine for positioning electronic components on a substrate comprising a support for the substrate, a pick-and-place head, moving means for effecting relative movement between the support and head so as to place a component carried by the head at a desired position on the substrate, component supply means for presenting components to the head for positioning of the substrate, the component supply means comprising support means for mounting a removable magazine in which components are stacked one on top of another so that a stacked uppermost one of the components can be removed from the top of an upper end portion of the removable magazine by the pick-up head, lifting means arranged to raise the stack of components in the removable magazine mounted on the support means on receipt of an appropriate signal wherein the removable magazine includes a guide portion having a passage shaped in cross-section to receive the components so that they are stacked one on another, a lower end portion extending partially across the passage to prevent components escaping from the lower end portion, a slot extending lengthwise down to and including the lower end portion, whereby the lifting means is introduced into the slot from the lower end when the magazine is mounted on the support means, and detector means for detecting whether or not an uppermost component carried in a magazine mounted on the support means is at a pick-up position and signalling the lifting means to raise the stack until a component is detected at the pick-up position.

9. A machine according to claim 8 in which the support means comprises upper and lower brackets, the lower brackets comprising a socket in which a lower end portion of a magazine is received to locate the lower end portion and the upper bracket having an opening in which an upper end portion of the magazine is received whereby to mount the magazine in a desired orientation on the support means.

10. A machine according to claim 9 in which the lifting means comprises a lifting member mounted on the support means for movement along a slot extending lengthwise of a magazine located on the support means and so constructed and arranged as to be introduced into the slot beneath a stack of components in the magazine.

11. A machine according to claim 10 in which the lifting means comprises a lead screw mounted for rotation on the support means, the lifting member comprising a nut received on the lead screw, and drive means by which the lead screw may be rotated to raise and lower the lifting member.

12. A machine according to claim 11 wherein the detector means comprises a radiation detector towards which radiation is directed across the pick-up position it prevents radiation reaching the detector but when on component is in the pick-up position the radiation is detected by the detector which signals the lifting means.

13. A machine according to claim 12 comprising upper and lower limit switches which are actuated when the lifting means reaches uppermost and lowermost limit positions in its travel.

* * * * *